US009774346B2

(12) United States Patent
Chen

(10) Patent No.: US 9,774,346 B2
(45) Date of Patent: Sep. 26, 2017

(54) DIGITAL-TO-ANALOG CONVERTOR AND RELATED DRIVING MODULE

(71) Applicant: NOVATEK Microelectronics Corp., Hsin-Chu (TW)

(72) Inventor: Ji-Ting Chen, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 34 days.

(21) Appl. No.: 14/876,842

(22) Filed: Oct. 7, 2015

(65) Prior Publication Data

US 2016/0300524 A1 Oct. 13, 2016

(30) Foreign Application Priority Data

Apr. 9, 2015 (TW) .............................. 104111484 A

(51) Int. Cl.
G09G 3/20 (2006.01)
H03M 1/76 (2006.01)
G09G 3/36 (2006.01)

(52) U.S. Cl.
CPC ............ *H03M 1/76* (2013.01); *G09G 3/3685* (2013.01); *G09G 3/3696* (2013.01); *G09G 2310/027* (2013.01)

(58) Field of Classification Search
None
See application file for complete search history.

(56) References Cited

U.S. PATENT DOCUMENTS

| 6,999,015 | B2 | 2/2006 | Zhang | |
|---|---|---|---|---|
| 7,511,650 | B2 * | 3/2009 | Chang | H03M 1/68 341/144 |
| 7,633,415 | B2 | 12/2009 | Chung | |
| 7,714,758 | B2 | 5/2010 | Ko | |
| 2014/0266835 | A1 * | 9/2014 | Price | H03M 1/808 341/145 |

* cited by examiner

*Primary Examiner* — Joseph Haley
*Assistant Examiner* — Emily Frank
(74) *Attorney, Agent, or Firm* — Winston Hsu

(57) ABSTRACT

A digital-to-analog convertor for a driving module of a display device is disclosed. The digital-to-analog convertor includes a plurality of switches, forming a tree structure with a plurality of stages for outputting one of a plurality of gamma voltages to an output end according to a plurality of bits of a digital input signal; and a bypass unit, coupled between a first output end of a first switch in the plurality of switches and the output end for adjusting a connection between the first output end and the output end according to a most significant bit in among the plurality of bits and the bits between the most significant bit and a first bit controlling the first switch in among the plurality of bits.

8 Claims, 4 Drawing Sheets

DIGITAL-TO-ANALOG CONVERTOR AND RELATED DRIVING MODULE

BACKGROUND OF THE INVENTION

1. Field of the Invention

The present invention relates to a digital-to-analog convertor for a display device and related driving module, and more particularly, to a digital-to-analog convertor with a short response time and related driving module.

2. Description of the Prior Art

A liquid crystal display (LCD) is a flat panel display which has the advantages of low radiation, light weight and low power consumption and is widely used in various information technology (IT) products, such as notebook computers, personal digital assistants (PDA), and mobile phones. An active matrix thin film transistor (TFT) LCD is the most commonly used transistor type in LCD families, especially in the large-size LCD family. A driving system installed in the LCD, includes a timing controller, source drivers and gate drivers. The source and gate drivers respectively control data lines and scan lines, which intersect to form a cell matrix. Each intersection is a cell including crystal display molecules and a TFT. In the driving system (e.g. a driving integrated circuit (IC)), the gate drivers are responsible for transmitting scan signals to gates of TFTs to turn on the TFTs on the panel. The source drivers are responsible for converting digital image data, sent by the timing controller, into analog voltage signals and outputting the voltage signals to sources of the TFTs. When the TFT receives the voltage signals, a corresponding liquid crystal molecule has a terminal whose voltage changes to equalize the drain voltage of the TFT, and thereby changes its own twist angle. The rate that light penetrates the liquid crystal molecule is changed accordingly, and thus different colors can be displayed on the panel.

As technology advances, the resolutions of the liquid crystal display gradually increases (e.g. increases from full high definition (HD) to 4K) and the image quality of the liquid crystal display is also improved. When the resolution of the liquid crystal display increases, charging times of the driving device (e.g. a driving IC), used for driving the display panel in the liquid crystal display, charging the display components in the display panel decrease. On the other hand, the number of bits of color signals requires to be increased in order to improve the image quality of the liquid crystal display. The increase of the number of the bits of the color signals also increases the resistance of a digital-to-analog converting circuit used for converting the color signals to analog voltages, such that the time of the digital-to-analog converting circuit generating the analog voltages according to the color signals is prolonged. Thus, how to decrease the time of the digital-to-analog converting circuit generating the analog voltages to fit the charging time that is decreased when the resolution of the liquid crystal display increases becomes a topic to be discussed.

SUMMARY OF THE INVENTION

In order to solve the above problem, the present invention provides a digital-to-analog convertor with a rapid response time and related driving module.

In an aspect, the present invention discloses a digital-to-analog convertor for a driving module of a display device. The digital-to-analog convertor comprises a plurality of switches and a bypass unit. The plurality of switches form a plurality of stages and is utilized for outputting one of a plurality of gamma voltages to an output end according to a plurality of bits of a digital input signal. The bypass unit is coupled between a first output end of a first switch among the plurality of switches and the output end and is utilized for adjusting a connection between the first output end and the output end according to a most significant bit among the plurality of bits and the bits between the most significant bit and a first bit controlling the first switch in the plurality of bits.

The present invention further discloses a driving module for a display device. The driving module comprises a gamma resistance voltage divider, a digital-to-analog convertor and an output stage amplifier. The gamma resistance voltage divider is utilized for generating a plurality of gamma voltages. The digital-to-analog convertor comprises a plurality of switches and a bypass unit. The plurality of switches form a plurality of stages and is utilized for outputting one of the plurality of gamma voltages to an output end according to a plurality of bits of a digital input signal. The bypass unit is coupled between a first output end of a first switch among the plurality of switches and the output end for adjusting a connection between the first output end and the output end according to a most significant bit among the plurality of bits and the bits between the most significant bit and a first bit controlling the first switch in the plurality of bits. The output stage amplifier comprises an amplifier input end coupled to the output end and an amplifier output end coupled to a data line of the display device via an output switch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
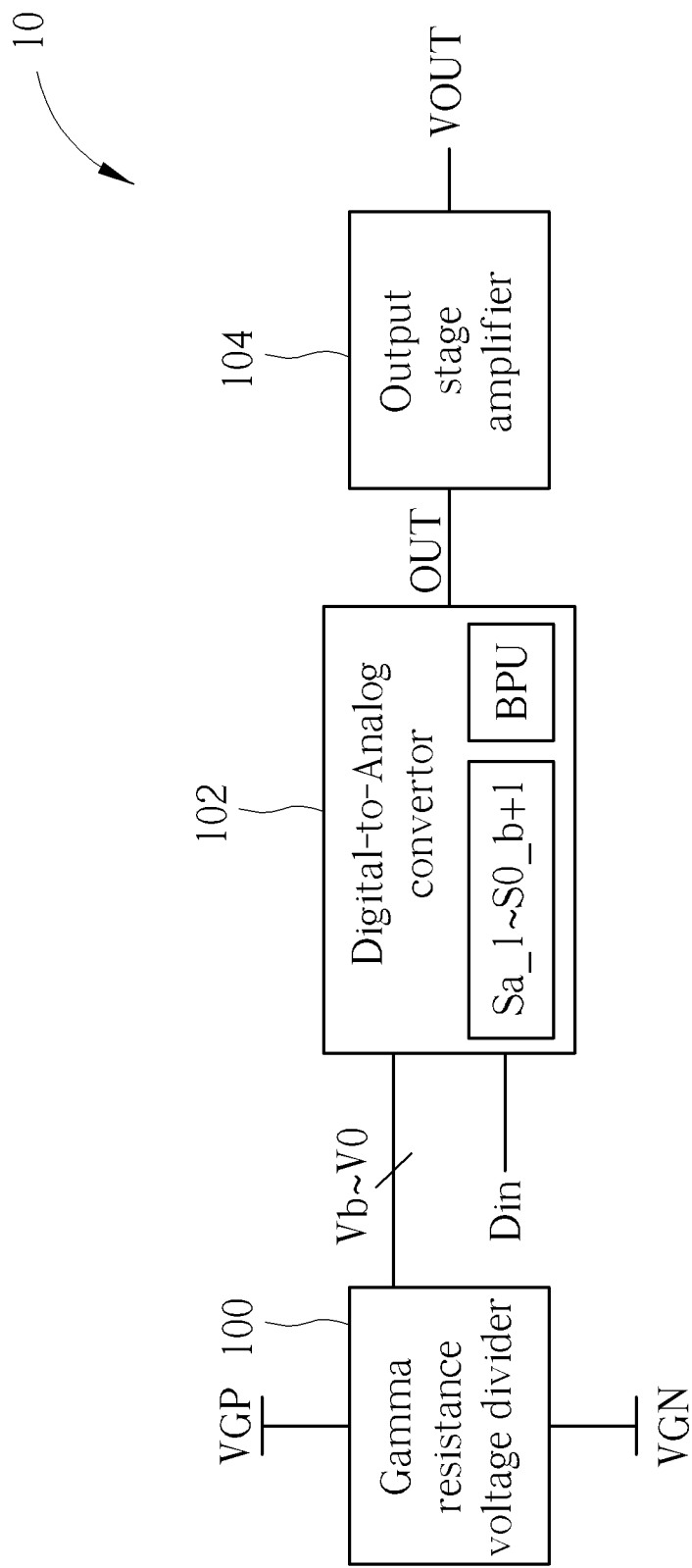
FIG. 1 is a schematic diagram of a driving module according to an example of the present invention.

Please refer to FIG. 1, which is a schematic diagram of a driving module 10 according to an example of the present invention. The driving module 10 may be utilized in an electronic product with a display panel, such as a smart phone, a tablet or a laptop. The driving module 10 is utilized for outputting one of a plurality of gamma voltages Vb-V0 according to a plurality of bits Ca-C0 of a digital input signal Din, wherein "a" is a constant and "b"=$2^{a+1}-1$. In an example, the driving module 10 is utilized in a source driver for driving the display panel, and is not limited herein. As shown in FIG. 1, the driving module comprises a gamma resistance voltage divider 100, a digital-to-analog convertor (DAC) 102 and an output stage amplifier 104. The gamma resistance voltage divider 100 is utilized for generating the gamma voltages Vb-V0, wherein the gamma voltages Vb-V0 are between voltages VGP and VGN. The DAC 102 is coupled to the gamma resistance voltage divider 100 and comprises a plurality of switches Sa_1-S0_b+1 forming a plurality of stages. The DAC 102 selects and outputs one of the gamma voltages Vb-V0 to the output end OUT according to the bits Ca-C0 of the digital input signal Din. According to the voltage of the output end OUT, the output stage amplifier 104 outputs a corresponded output voltage VOUT to the display component of the display panel (e.g. a data line or an end of a liquid crystal molecule, not shown in FIG. 1) via an output switch SOUT, to control the display component.

In order to improve the response time of the DAC 102, the DAC 102 further comprises a bypass unit BPU. The bypass unit BPU is coupled between an output end OUT_Sx of a switch Sx among the plurality of switches Sa_1-S0_b+1 and the output end OUT, to adjust a connection CONNx between the output end OUT_Sx and the output end OUT according to the most significant bit Ca among the bits Ca-C0 and the bits between the most significant bit (MSB) Ca and a bit Cx used for controlling the switch Sx. When the MSB Ca and the bits between the MSB Ca and the bit Cx instruct conducting the switches located on the path from the output end OUT_Sx to the output end OUT, the bypass unit BPU conducts the connection CONNx; and when the MSB Ca and the bits between the MSB Ca and the bit Cx instruct disconnecting the switches located on the path from the output end OUT_Sx to the output end OUT, the bypass unit BPU disconnects the connection CONNx. The response time of the DAC 102 is therefore shortened.

Figure 2:
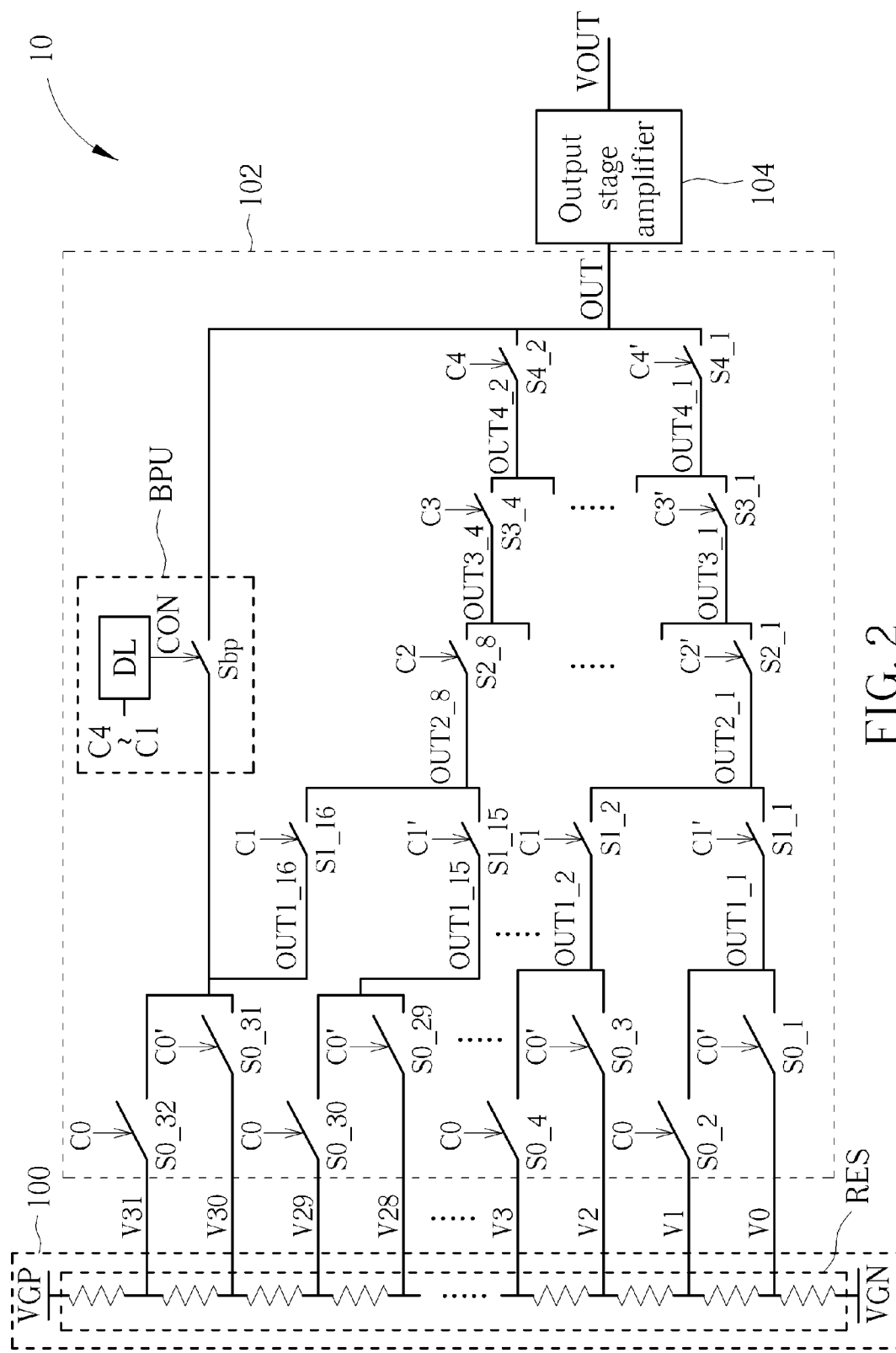
FIG. 2 is a schematic diagram of an implementation of the driving module shown in FIG. 1.

As to the detailed structure and operations of the driving module 10 please refer to FIG. 2, which is a schematic diagram of an implementation of the driving module 10 shown in FIG. 1. In this example, the gamma resistance voltage divider 100 generates gamma voltages V31-V0 via a resistor string RES and the digital input signal Din comprises bits C4-C0 (i.e. the bit number of the digital input signal Din is 5). The bit C4 is the MSB and the C0 is the least significant bit (LSB). The DAC 102 comprises switches S0_1-S0_32, S1_1-S1_16, S2_1-S2_8, S3_1-S3_4, S4_1 and S4_2 (i.e. the plurality of switches Sa_1-S0_b+1). In this example, the switches S0_1-S0_32, S1_1-S1_16, S2_1-S2_8, S3_1-S3_4, S4_1 and S4_2 form a tree structure. The switches S0_1-S0_32 form a first stage of the tree structure and are coupled to the gamma voltages V0-V31, respectively. The switches S1_1-S1_16 form a second stage of the tree structure and are coupled to output ends OUT1_1-OUT1_16, respectively, and so on. The switches S0_1-S0_32, S1_1-S1_16, S2_1-S2_8, S3_1-S3_4, S4_1 and S4_2 are respectively controlled by the bits C0-C4 and inverse signals C0'-C4' of the bits C0-C4. Under such a condition, the DAC 102 selects and outputs one of the gamma voltages V0-V31 to the output end OUT according to the bits C0-C4. The output stage amplifier 104 then generates the output voltage VOUT according to the voltage of the output end OUT.

As can be seen from FIG. 2, the conducting path from the gamma resistance voltage divider 100 to the output stage amplifier 104 at least comprises 5 switches. Assuming the resistance of each of the switches S0_1-S0_32, S1_1-S1_16, S2_1-S2_8, S3_1-S3_4, S4_1 and S4_2 is R and the capacitance of the output end OUT is C. The time constant of the path from the resistance voltage divider 100 to the output stage amplifier 104 would be 5RC. If the number of bits of the digital input signal Din increases, the number of switches on the path from the resistance voltage divider 100 to the output stage amplifier 104 also increases. In other words, the time constant of the path from the resistance voltage divider 100 to the output stage amplifier 104 increases with the number of bits of the digital input signal Din, such that the response time of the DAC 102 significantly rises.

In order to improve the response time of the DAC 102, the present invention adds the bypass unit BPU between the output end OUT1_16, corresponding to the abovementioned output end OUT_Sx, and the output end OUT. In this example, the bypass unit BPU comprises a bypass switch Sbp, corresponding to the connection CONNx, and a determining logic circuit DL. When the bits C4-C1 instruct conducting the switches S1_16, S2_8, S3_4, and S4_2 on the conducting path from the output end OUT1_16 to OUT, the determining logic circuit DL adjusts a control signal CON to conduct the bypass unit Sbp. That is, when the digital input signal Din indicates outputting the gamma voltage V31 or V30, the number of switches on the conducting path from gamma resistance voltage divider 100 to the output stage amplifier 104 decreases to 2. In other words, the time constant the conducting path from the gamma resistance voltage divider 100 to the output stage amplifier 104 when the digital input signal Din indicates outputting the gamma voltage V31 or V30 decreases from 5RC to 2RC. The response time of the DAC 102 is therefore improved.

Figure 3:
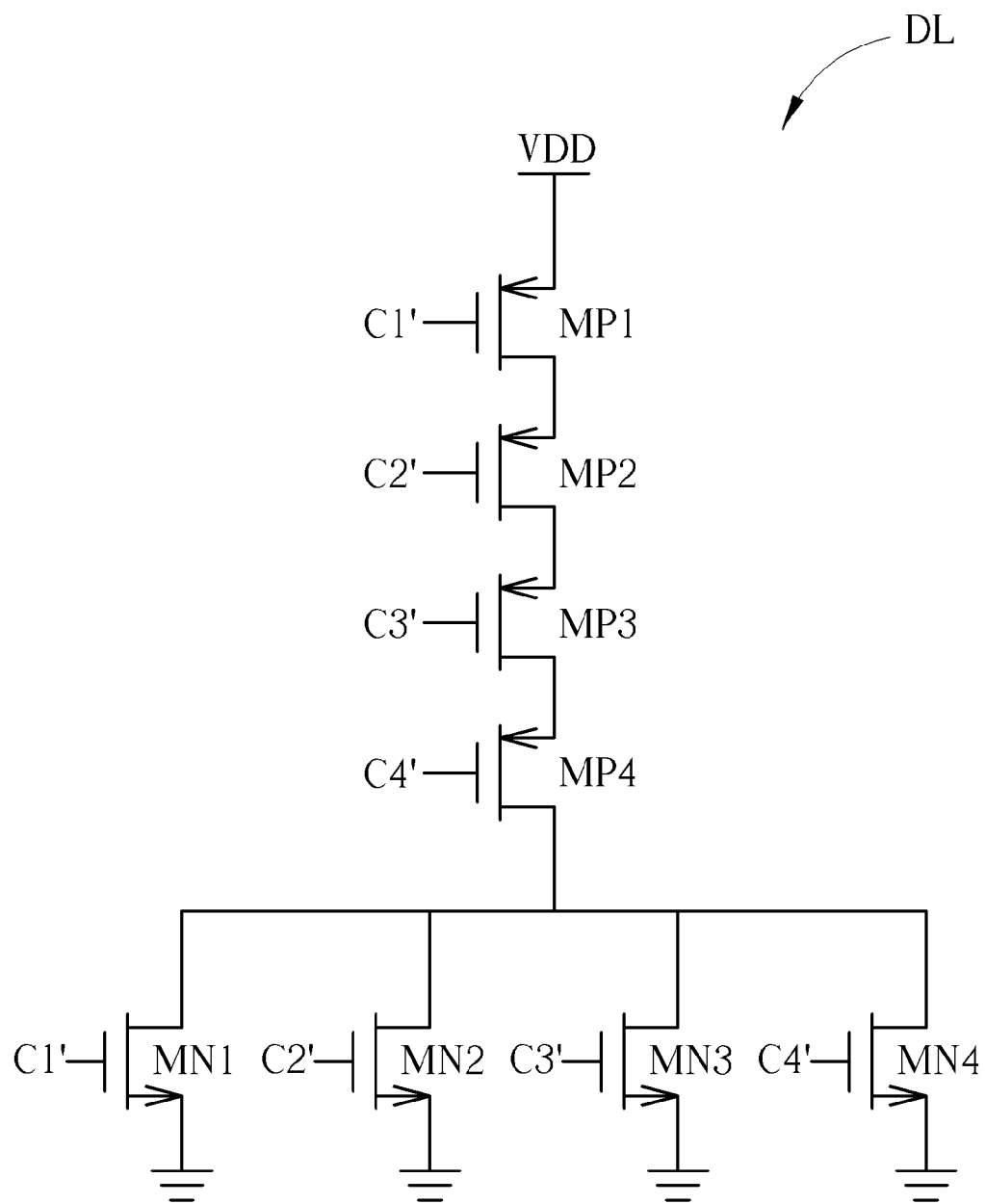
FIG. 3 is a schematic diagram of an implementation of the determining logic circuit shown in FIG. 2.

Via adding the bypass unit between the output end of one of the plurality of switches in the tree architecture and the output end of the DAC, the response time of the DAC in the above examples is effectively improved. According to different applications and design concepts, those with ordinary skill in the art may observe appropriate alternations and modifications. For example, the DAC 102 may comprise a plurality of bypass unit BPU, to improve the response times of multiple paths from the gamma resistance voltage divider 100 to the output stage amplifier 104. In addition, the determining logic circuit DL used for generating the control signal CON may be realized in various structures. The determining logic circuit DL shown in FIG. 2 may be a NOR gate with 4 input ends. Please refer to FIG. 3, which is a schematic diagram of an implementation of the determining logic circuit DL shown in FIG. 2. As shown in FIG. 3, the determining logic circuit DL comprises transistors MP1-MP4 and MN1-MN4, wherein the transistors MP1-MP4 are P-type Metal-Oxide-Semiconductor Field-Effect Transistors (MOSFETs) and the transistors MN1-MN4 are N-type MOSFETs. The gates of the transistors MP1-MP4 are coupled to the inverse signal C1'-C4' of the bits C4-C1, respectively, and the gates of the transistors MN1-MN4 are also coupled to the inverse signal C1'-C4', respectively. When the bits C4-C1 are at a high logic level to instruct conducting the switches S1_1, S2_8, S3_4 and S4_2, the determining logic circuit DL adjusts the control signal to the high logic level, to conduct the bypass switch Sbp for reducing the response time of the DAC.

Figure 4:
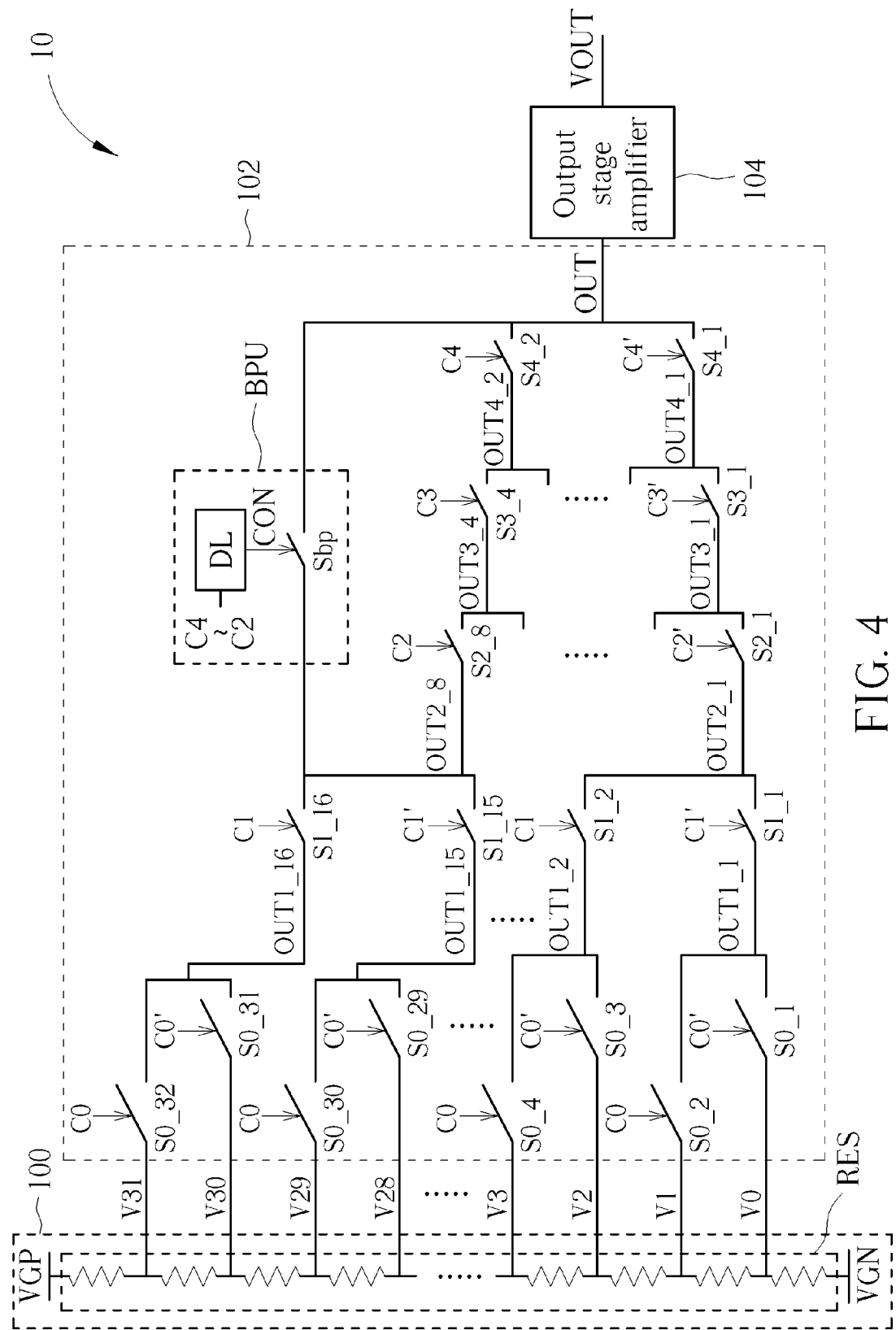
FIG. 4 is a schematic diagram of another implementation of the driving module shown in FIG. 1.

In addition, the bypass unit BPU is not limited to couple to the output end OUT1_16 of the first stage as shown in FIG. 2. The bypass unit BPU may be coupled to anyone of the output ends of the switches S0_1-S0_32, S1_1-S1_16, S2_1-S2_8 and S3_1-S3_4. Please refer to FIG. 4, which is a schematic diagram of another implementation of the driving module 10 shown in FIG. 1. The driving module 10 shown in FIG. 4 is similar to that shown in FIG. 2, thus the components and signals with the similar functions use the same symbols. Different from FIG. 2, the bypass switch Sbp shown in FIG. 4 is coupled between the output end OUT2_8 of the switch S1_16 of the second stage. The references of the determining logic circuit DL controlling the bypass switch Sbp change to the bits C4-C2. When the digital input signal Din indicates outputting one of the gamma voltages V31-V28, the minimum number of the conducting path from the gamma resistance voltage divider 100 to the output stage amplifier 104 decreases to 3. In such a condition, the time constant of the conducting path from the gamma resistance voltage divider 100 to the output stage amplifier 104 reduces from 5RC to 3RC.

In comparison with the driving module 10 shown in FIG. 2, the minimum time constant of the DAC 102 shown in FIG. 4 slightly increases from 2RC to 3RC. However, the number of conducting paths whose response time is reduced by the bypass unit BPU increases from 2 to 4. According to different applications and design concepts, those with ordinary skill in the art can appropriately configure the bypass unit BPU to optimize the response time of the DAC 102 and the number of conducting paths whose response time is improved by the bypass unit BPU.

In addition, the switches Sa_1-S0_b+1 in the DAC 102 are not limited to form the tree structure shown in FIG. 2. As long as the switches Sa_1-S0_b+1 form a plurality of stages, the bypass unit BPU coupled between the output of one of the plurality of stages and the output OUT of the DAC 102 can shorten the response time of the DAC 102. The structure of the switches Sa_1-S0_b+1 can be appropriately altered according to different applications and designed concepts.

To sum up, the response time of the DAC in the above examples is effectively improved via adding the bypass unit between the output end of one of the plurality of switches in the tree architecture and the output end of the DAC. As a result, even if the number of bits of the digital input signal increases because the resolution of the display device increase, the response time of the DAC remains unaffected.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog convertor for a display device, the digital-to-analog convertor comprising:
a plurality of switches, forming N cascading stages, wherein each of the stages has a plurality of first ends and a plurality of second ends, the first ends of each of the stages are coupled to the second ends of a preceding stage and N is a number of bits of a digital input signal; and
a bypass switch, coupled between one of the second ends of an $i^{th}$ stage of the plurality of switches and an output end of the digital-to-analog convertor for forming a connection between the one of the second ends of the $i^{th}$ stage of the plurality of switches and the output end of the digital-to-analog convertor according to logic states of (N-i) higher significant bits of the digital input signal, wherein i is an integer that is smaller than N and not smaller than 1 and an $i^{th}$ bit of the digital input signal is counted contiguously upward from a least significant bit of the digital input signal.

2. The digital-to-analog convertor of claim 1, wherein the first ends of a first stage of the plurality of switches are coupled to a plurality of gamma voltages and the second ends of a last stage of the plurality of switches are coupled to the output end of the digital-to-analog convertor.

3. The digital-to-analog convertor of claim 2, wherein the plurality of gamma voltages is generated by a gamma resistance voltage divider.

4. The digital-to-analog convertor of claim 1, wherein the bypass switch conducts the connection between the one of the second ends of the $i^{th}$ stage of the plurality of switches and the output end of the digital-to-analog convertor when the (N-i) higher significant bits of the digital input signal are asserted to conduct the path that is between the one of the second ends of the $i^{th}$ stage of the plurality of switches and the output end of the digital-to-analog converter through stages succeeding to the $i^{th}$ stage of the plurality of switches.

5. The digital-to-analog convertor of claim 1, wherein the output end of the digital-to-analog convertor is coupled to an amplifier input end of an output stage amplifier and an amplifier output end of the output stage amplifier is coupled to a data line of the display device.

6. A driving module for a display device, the driving module comprising:
a gamma resistance voltage divider, for generating a plurality of gamma voltages;
a digital-to-analog convertor, comprising:
a plurality of switches, forming N cascading stages, wherein each of the stages has a plurality of first ends and a plurality of second ends, the first ends of each of the stages are coupled to the second ends of a preceding stage and N is a number of bits of a digital input signal; and
a bypass switch, coupled between one of the second ends of an $i^{th}$ stage of the plurality of switches and an output end of the digital-to-analog convertor for forming a connection between the one of the second ends of the $i^{th}$ stage of the plurality of switches and the output end of the digital-to-analog convertor according to logic states of (N-i) higher significant bits of the digital input signal, wherein i is an integer that is smaller than N and not smaller than 1 and an $i^{th}$ bit of the digital input signal is counted contiguously upward from a least significant bit of the digital input signal; and
an output stage amplifier, comprising an amplifier input end coupled to the output end of the digital-to-analog convertor and an amplifier output end coupled to a data line of the display device.

7. The driving module of claim 6, wherein the first ends of a first stage of the plurality of switches are coupled to the plurality of gamma voltages and the second ends of a last stage of the plurality of switches are coupled to the output end of the digital-to-analog convertor.

8. The driving module of claim 6, wherein the bypass switch conducts the connection between the one of the second ends of the $i^{th}$ stage of the plurality of switches and the output end of the digital-to-analog convertor when the (N-i) higher significant bits of the digital input signal are asserted to conduct the path that is between the one of the second ends of the $i^{th}$ stage of the plurality of switches and the output end of the digital-to-analog converter through stages succeeding to the $i^{th}$ stage of the plurality of switches.

* * * * *